United States Patent
Motosugi

(10) Patent No.: US 9,852,883 B2
(45) Date of Patent: Dec. 26, 2017

(54) CHARGED PARTICLE BEAM DRAWING APPARATUS AND CHARGED PARTICLE BEAM DRAWING METHOD

(71) Applicant: NuFlare Technology, Inc., Yokohama-shi (JP)

(72) Inventor: Tomoo Motosugi, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/427,200

(22) Filed: Feb. 8, 2017

(65) Prior Publication Data

US 2017/0243718 A1    Aug. 24, 2017

(30) Foreign Application Priority Data

Feb. 23, 2016    (JP) .................................. 2016-032156

(51) Int. Cl.
*H01J 37/00*    (2006.01)
*H01J 37/302*    (2006.01)
*H01J 37/317*    (2006.01)

(52) U.S. Cl.
CPC ...... *H01J 37/3023* (2013.01); *H01J 37/3174* (2013.01); *H01J 2237/30411* (2013.01)

(58) Field of Classification Search
CPC ............... H01J 37/3023; H01J 37/3174; H01J 2237/30411
USPC ........................................... 250/492.1–492.3
See application file for complete search history.

(56) References Cited

U.S. PATENT DOCUMENTS

| 6,610,989 B1 * | 8/2003 | Takahashi | B82Y 10/00 250/492.1 |
| 2010/0173235 A1 * | 7/2010 | Kato | B82Y 10/00 430/30 |
| 2015/0155138 A1 * | 6/2015 | Yoshikawa | H01J 37/3177 250/492.22 |

FOREIGN PATENT DOCUMENTS

| JP | 2000-77364 | 3/2000 |
| JP | 2000-353656 | 12/2000 |
| JP | 2006-73867 | 3/2006 |
| JP | 2012-174812 | 9/2012 |

* cited by examiner

*Primary Examiner* — Michael Maskell
(74) *Attorney, Agent, or Firm* — Oblon, McClelland, Maier & Neustadt, L.L.P.

(57) ABSTRACT

In one embodiment, A charged particle beam drawing apparatus includes an irradiation amount resetting processing circuitry changing the irradiation amount in the shot data to the irradiation amount lower limit value when the irradiation amount defined in the shot data is less than the irradiation amount lower limit value, a shot size adjustment processing circuitry changing the shot size defined in the shot data, based on an amount of the change in the irradiation amount, a shot position adjustment processing circuitry changing the shot position defined in the shot data, based on an amount of the change in the shot size, and a drawing device drawing a pattern by irradiating the substrate with the charged particle beam, using the shot data in which the irradiation amount, the shot size, and the shot position have been changed.

8 Claims, 7 Drawing Sheets

FIG. 4A
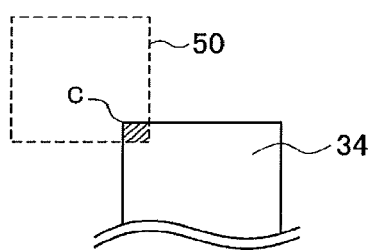
FIG. 4B
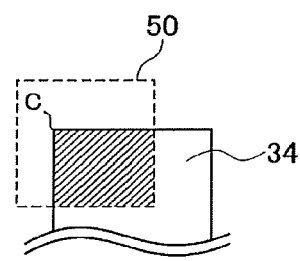
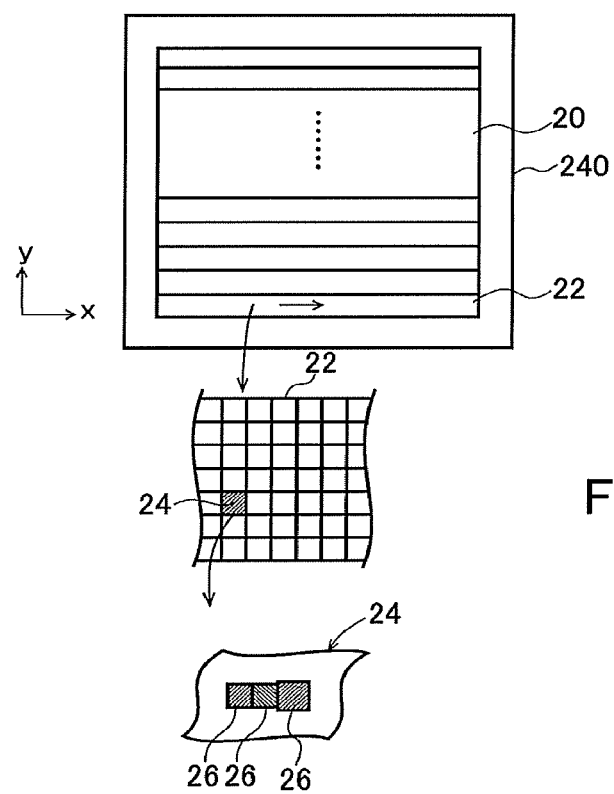
FIG. 5

CHARGED PARTICLE BEAM DRAWING APPARATUS AND CHARGED PARTICLE BEAM DRAWING METHOD

CROSS REFERENCE TO RELATED APPLICATION

This application is based upon and claims benefit of priority from the Japanese Patent Application No. 2016-032156, filed on Feb. 23, 2016, the entire contents of which are incorporated herein by reference.

FIELD

The present invention relates to a charged particle beam drawing apparatus and a charged particle beam drawing method.

BACKGROUND

As the level of integration of the LSI is increased, the circuit line widths of semiconductor devices are further made finer. As a method of forming a mask (a counterpart used by a stepper or a scanner is also called a reticle) for exposure for forming a circuit pattern in these semiconductor devices, an electron beam drawing technique having an excellent resolution performance is being used.

LER (Line Edge Roughness) of a pattern formed on a mask depends on the area density of the pattern and an irradiation amount of electron beam, and it is known that when the area density is high and the irradiation amount is low, the LER deteriorates. In mask drawing, in order to correct dimensional variation caused by a proximity effect which occurs at the time of drawing or by a loading effect which occurs in an etching process after the drawing, the irradiation amount for an area with a high pattern area density is often reduced, and the LER tends to deteriorate in such an area.

In order to improve the LER, an approach may be taken in which the irradiation amount is overall enhanced, that is, the base dose (the dose amount when the pattern density is 100%) is increased. However, when the base dose is increased, there is a problem in that dimensional displacement or positional displacement of a pattern occurs, or the throughput is decreased due to increase in an irradiation time.

BRIEF DESCRIPTION OF THE DRAWINGS

FIG. 4A is an illustration showing an example of forming a small-size rectangular image, FIG. 4B is an illustration showing an example of forming a large-size rectangular image.

FIG. 5 is a schematic diagram for explaining a drawing area.

DETAILED DESCRIPTION

Figure 1:
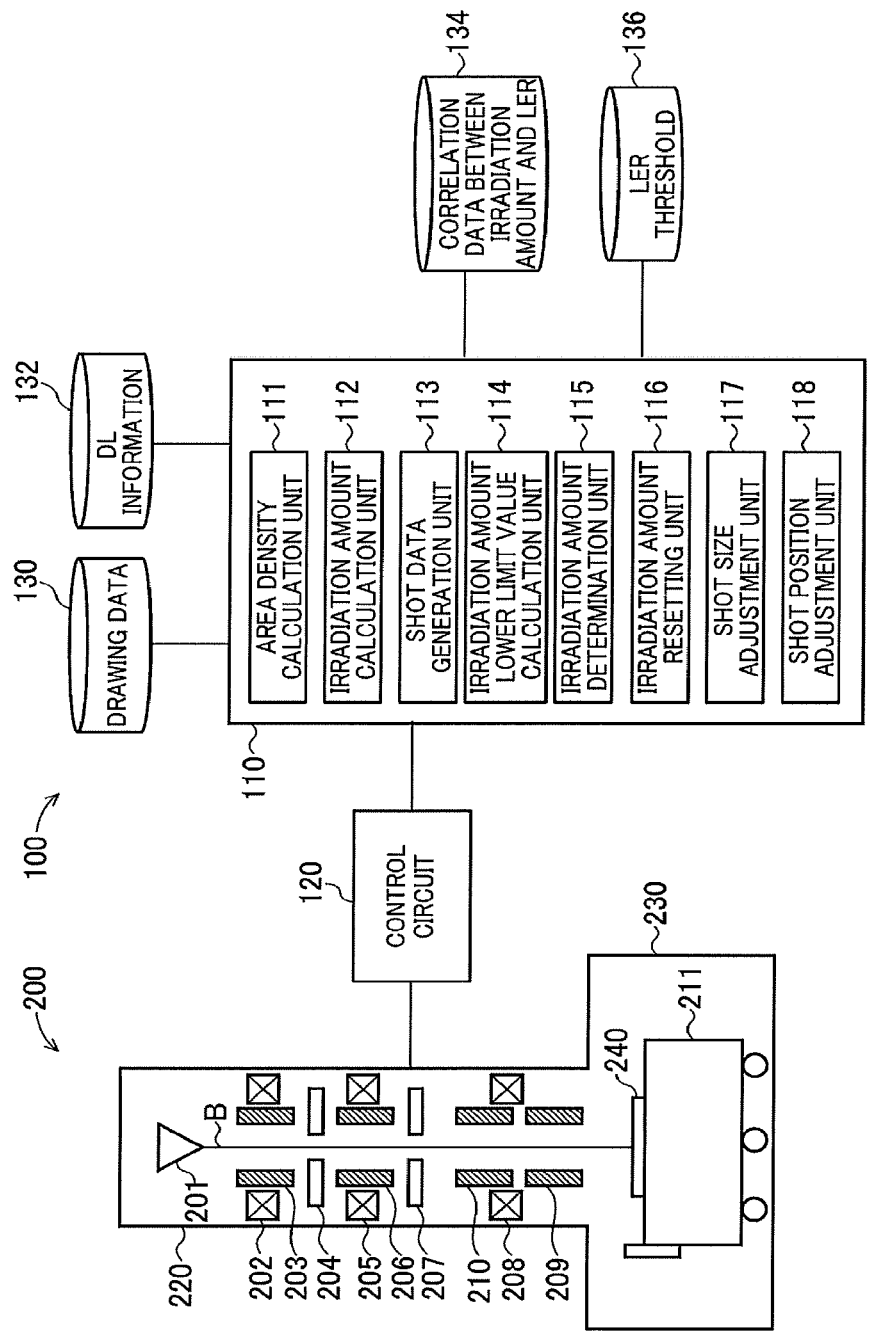
FIG. 1 is a schematic diagram of an electron beam drawing apparatus according to an embodiment of the present invention.

In one embodiment, a charged particle beam drawing apparatus includes an area density calculation processing circuitry calculating a pattern area density of a pattern to be drawn on a substrate based on drawing data, a shot data generation processing circuitry generating shot data which is formed of shot of a charged particle beam as a component unit using the drawing data, and in which a shot size, a shot position and an irradiation amount are defined, an irradiation amount determination processing circuitry determining whether or not the irradiation amount defined in the shot data is greater than or equal to an irradiation amount lower limit value corresponding to the pattern area density, an irradiation amount resetting processing circuitry changing the irradiation amount in the shot data to the irradiation amount lower limit value when the irradiation amount defined in the shot data is less than the irradiation amount lower limit value, a shot size adjustment processing circuitry changing the shot size defined in the shot data, based on an amount of the change in the irradiation amount made by the irradiation amount resetting processing circuitry, a shot position adjustment processing circuitry changing the shot position defined in the shot data, based on an amount of the change in the shot size made by the shot size adjustment processing circuitry, and a drawing device drawing a pattern by irradiating the substrate with the charged particle beam, using the shot data in which the irradiation amount, the shot size, and the shot position have been changed.

An embodiment of the present invention will be described below with reference to the drawings.

FIG. 1 is a schematic diagram of an electron beam drawing apparatus according to an embodiment of the present invention. The electron beam drawing apparatus shown in FIG. 1 a variable shaping type drawing apparatus including a control unit 100 and a drawing unit 200.

The drawing unit 200 includes an electronic lens barrel 220 and a drawing chamber 230. In the electronic lens barrel 220, there are disposed an electron gun 201, a lighting lens 202, a blanker 203, a first shaping aperture 204, a projection lens 205, a shaping deflector 206, a second shaping aperture 207, an objective lens 208, a main deflector 209, and a secondary deflector 210.

In the drawing chamber 230, an XY stage 211 is disposed. On the XY stage 211, a substrate 240, on which drawing is to be performed, is mounted. As the substrate 240, a mask for exposure when a semiconductor device is manufactured, a semiconductor substrate (silicon wafer) on which a semiconductor device is manufactured, and the like are included. Also, as the substrate 240, a mask blank is included, to which a resist is applied and on which nothing has been drawn yet.

When an electron beam B discharged from the electron gun 201 (discharge unit) provided in the electronic lens barrel 220 passes through the blanker (blanking deflector)

203, switching between whether or not the substrate 240 is irradiated with the electron beam is performed by the blanker 203.

The entire first shaping aperture 204 having a rectangular opening 32 (see FIG. 2) is irradiated with the electron beam B by the lighting lens 202. The electron beam B passes through the opening 32 of the first shaping aperture 204, thereby being shaped in a rectangle.

Figure 2:
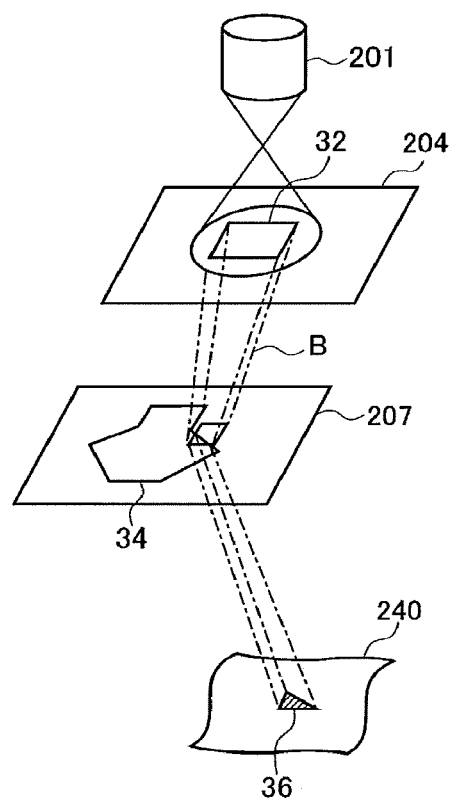
FIG. 2 is a perspective view of a first shaping aperture and a second shaping aperture.

The electron beam B of a first aperture image, which has passed through the first shaping aperture 204, is projected by the projection lens 205 on the second shaping aperture 207 having an opening 34 (see FIG. 2). At this point, deflection of the first aperture image projected on the second shaping aperture 207 is controlled by the deflector 206, and the shape and dimensions of the electron beam which passes opening 34 can be changed (variable shaping is performed) as in the below-described FIG. 3.

The electron beam B of a second aperture image, which has passed through the second shaping aperture 207, is focused by objective lens 208, and deflected by the main deflector 209 and the secondary deflector 210, then a target position on the substrate 240 mounted on the XY stage 211 which moves continuously is irradiated with the electron beam B.

FIG. 2 is a schematic perspective view for illustrating the beam shaping by the first shaping aperture 204 and the second shaping aperture 207. In the first shaping aperture 204, the rectangular opening 32 for shaping the electron beam B is formed.

In addition, in the second shaping aperture 207, there is formed a variable shaping opening 34 that shapes the electron beam B in a desired shape, which has passed through the opening 32 of the first shaping aperture 204. As in the below-described FIG. 3, the variable shaping opening 34 has a shape that combines sides 34a, 34e parallel to one side of the opening 32, sides 34b, 34h perpendicular to the one side, and sides 34c, 34d, 34f, 34g which form 45 degrees or 135 degrees with respect to the one side of the opening 32.

The variable shaping opening 34 is an octagonal shape that has in common a hexagonal shaped portion surrounded by the sides 34c to 34g, and a rectangular shaped portion which is surrounded by the sides 34a, 34b, 34h and contiguous to the hexagonal shaped portion.

A beam shape, which can pass through both the opening 32 of the first shaping aperture 204 and the variable shaping opening 34 of the second shaping aperture 207, is drawn on a drawing area of the substrate 240 mounted on the continuously-moving XY stage 211.

Figure 3:
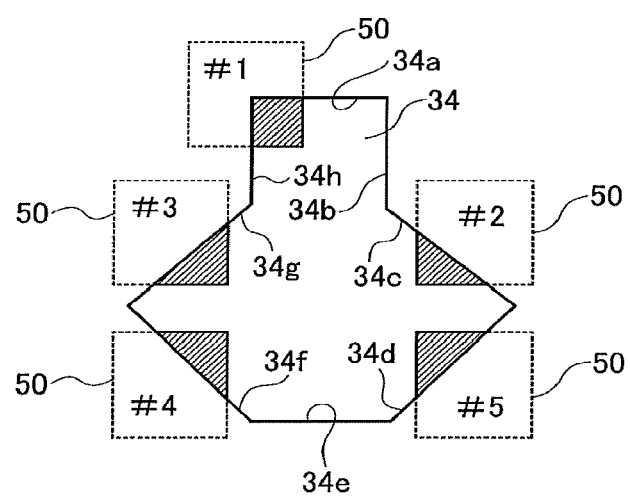
FIG. 3 is a plan view showing an example of overlapping positions between first aperture images and a variable shaping opening of the second shaping aperture.

FIG. 3 is a plan view showing an example of overlapping positions between first aperture images 50 which have passed through the opening 32 of the first shaping aperture 204, and the variable shaping opening 34 of the second shaping aperture 207.

When the electron beam B is shaped into a rectangle, the first aperture image 50 is deflected by the deflector 206, and the position indicated by #1 is irradiated with the electron beam B. A shaded area, which passes through the variable shaping opening 34, corresponds to a shaped image.

When the electron beam B is shaped into an isosceles right triangle, the first aperture image 50 is deflected by the deflector 206, and one of the positions #2 to #5 is irradiated with the electron beam B.

As shown in FIGS. 4A, 4B, changing the size of the portion which passes through the variable shaping opening 34 of the first aperture image 50 causes the dimensions of an image (shot) to change while maintaining the rectangular shape. In FIG. 4A, a small-size rectangular image is formed by decreasing the overlap between the first aperture image 50 and the variable shaping opening 34. In FIG. 4B, a large-size rectangular image is formed by increasing the overlap between the first aperture image 50 and the variable shaping opening 34.

In this manner, the electron beam 200 can be shaped into desired shape and size by changing the irradiation position (deflection position) of the first aperture image 50 on the second shaping aperture 207.

FIG. 5 is a schematic diagram for explaining a drawing area. In FIG. 5, in a deflectable range of the main deflector 209, a drawing area 20 of the substrate 240 is virtually divided into a plurality of strip areas 22 in rectangles in y direction, for instance. Also, in a deflectable size of the secondary deflector 210, each strip area 22 is virtually divided into a plurality of sub-fields (SF) 24 in a mesh. A shot figure is then drawn at each of shot positions 26 of each SF 24.

As shown in FIG. 1, the control unit 100 has a control computer 110, a control circuit 120, and storage units 130, 132, 134, 136. Drawing data is inputted from the outside and stored in the storage unit 130. The storage unit may be a hard disk device or a memory.

In the storage unit 132, DL (dose latitude) information is stored. The DL information is information that indicates a relationship between the irradiation amount (dose amount) of electron beam with which the substrate 240 is irradiated, and the line width (CD) of a pattern formed on the substrate 240. For instance, the DL information indicates an amount of change in line width when the dose amount is changed by 1%. The DL information is prepared for each of a plurality of different area densities.

In the storage unit 134, correlation data between the irradiation amount of electron beam with which the substrate 240 is irradiated, and LER (line edge roughness) of a pattern formed on the substrate 240 is inputted from the outside and stored. The correlation data is prepared for each of the plurality of different area densities.

Figure 6:
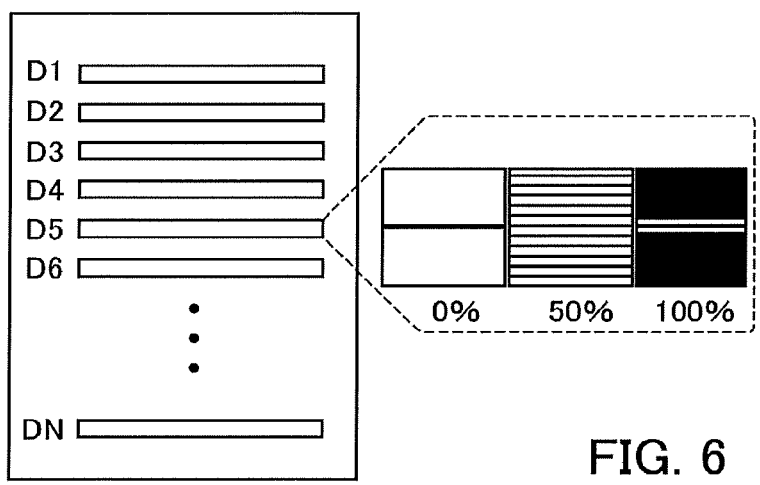
FIG. 6 is an illustration explaining a method of generating correlation data between irradiation amount and LER.

A method of generating correlation data between irradiation amount and LER will be described. For instance, as shown in FIG. 6, a pattern set is disposed, which forms a set of a line pattern with approximately 0% of a pattern area density, a line pattern with 50% of a pattern area density, and a line pattern with 100% of a pattern area density. The value of an irradiation amount D of electron beam is changed (N types of irradiation amounts, D1 to DN (N is an integer greater than or equal to 2)), and drawing is made on a mask. Next, LER of a drawn pattern is evaluated. For instance, for one edge in a pattern of line and space, fine depressions and projections in ROI (Region Of Interest) are measured by a dimensional SEM, then a variation in the depressions and projections is calculated, which is determined to be the edge roughness.

Figure 7:
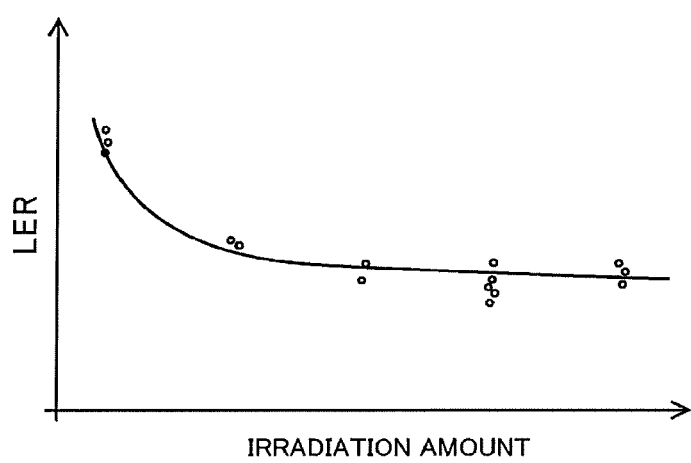
FIG. 7 is a graph showing a correlation between irradiation amount and LER.

Next, measurement points are plotted with the horizontal axis representing irradiation amount and the vertical axis representing LER, then function fitting is performed. FIG. 7 is a graph showing correlation data (correlation function) between irradiation amount and LER for a certain area density. Such correlation data is determined for each area density, and stored in the storage unit 134.

In the storage unit 136, a threshold value (acceptable value of LER) of LER required for a pattern formed on the substrate 240 is inputted from the outside and stored.

The control computer 110 has an area density calculation unit 111, an irradiation amount calculation unit 112, a shot data generation unit 113, an irradiation amount lower limit value calculation unit 114, an irradiation amount determination unit 115, an irradiation amount resetting unit 116, a shot size adjustment unit 117, and a shot position adjustment unit 118.

Each unit of the control computer 110 may be formed by hardware such as an electrical circuit or formed by software. When the unit is formed by software, a program which achieves at least part of the function of the control computers 110 may be stored in a recording medium, and is read and executed by a computer including an electrical circuit. The recording medium is not limited to a removable recording medium such as a magnetic disk or an optical disk, and may be a fixed recording medium such as a hard disk drive or a memory.

Figure 8:
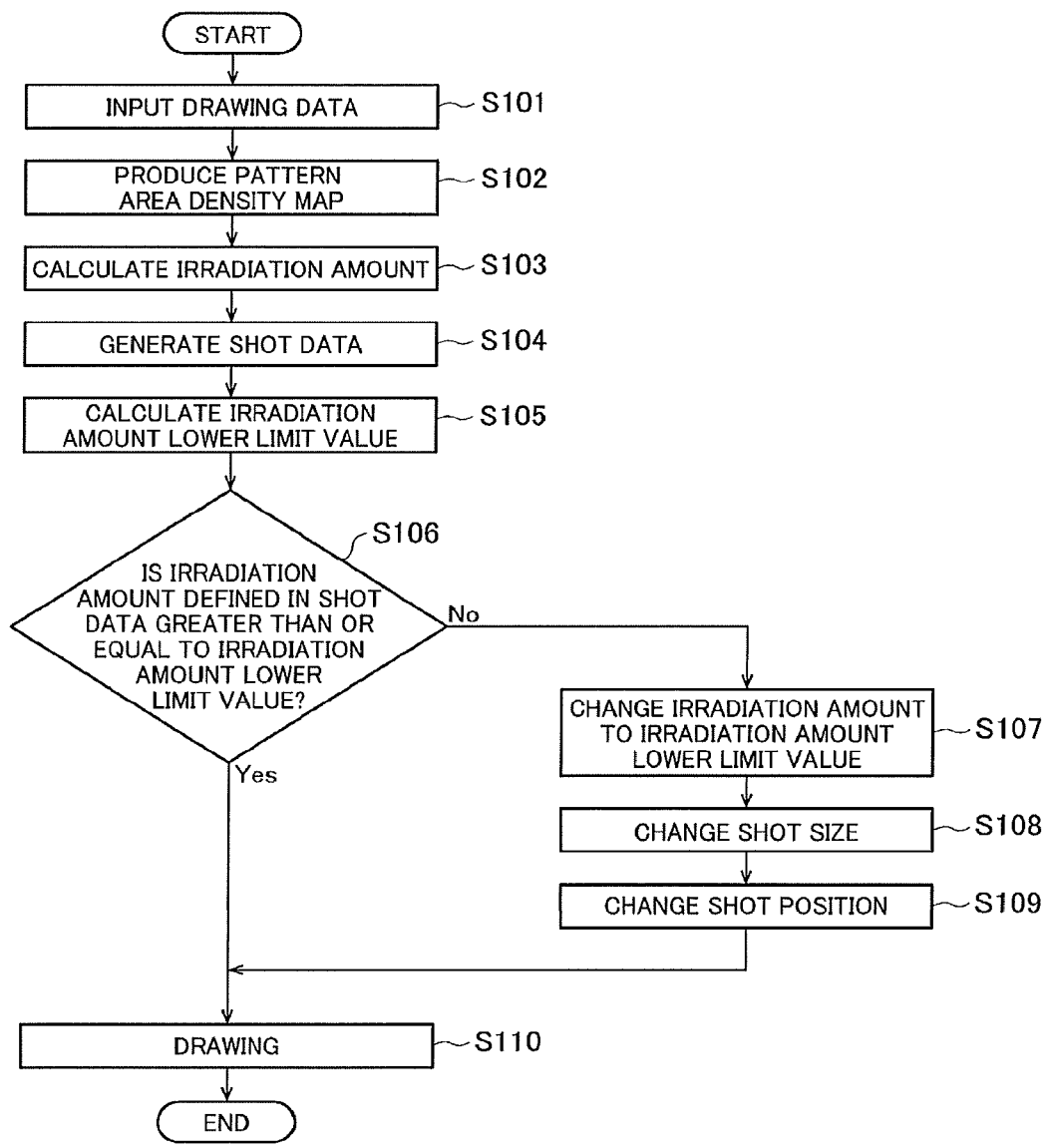
FIG. 8 is a flowchart explaining a drawing method according to the embodiment.

FIG. 8 is a flowchart explaining a drawing method according to this embodiment. The function of each unit of the control computer 110 will be described with reference to the flowchart shown in FIG. 8.

When the control computer 110 reads drawing data from the storage unit 130 (step S101), the area density calculation unit 111 divides a chip area into a plurality of small areas in a mesh, calculates an area density of each small area to produce a pattern area density map (step S102). The area density can be shown in terms of a value obtained by dividing a cumulative added value of the area of a figure located inside each small area by the area of the small area. The pattern area density map is stored in a memory (illustration omitted).

The irradiation amount calculation unit 112 fetches the pattern area density map from the memory, and uses a heretofore known method to calculate an irradiation amount for correcting a dimensional variation caused by a proximity effect, foggy, and a loading effect (step S103). The calculated irradiation amount is stored in a memory (illustration omitted).

The shot data generation unit 113 performs data conversion processing on the drawing data in multiple stages, and generates shot data in a format in the apparatus (step S104). The shot data generation unit 113 converts a plurality of figure patterns defined in the drawing data into shot figures each of which has a size (shapable size) to allow irradiation by one-time electron beam, and produces shot data in which an irradiation position of each shot figure, a shot figure size, and a type of shot figure are defined. In addition, in the shot data, an irradiation amount for each shot is defined based on the irradiation amount calculated by the irradiation amount calculation unit 112.

Figure 9:
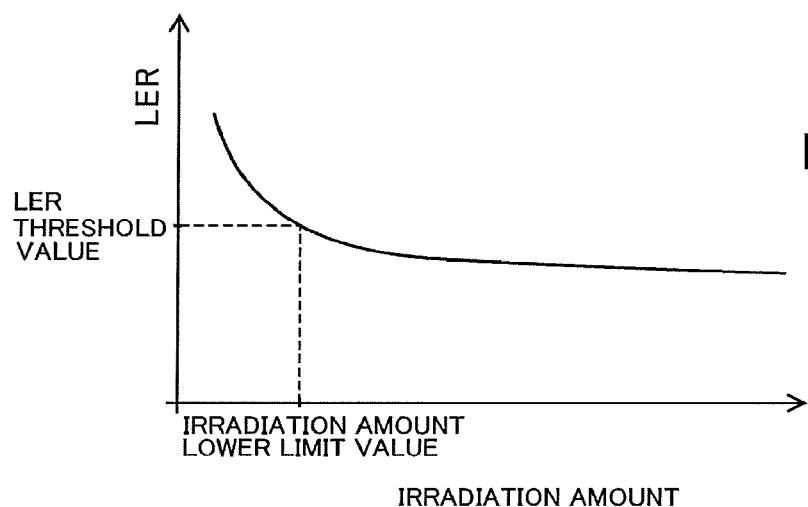
FIG. 9 is a graph illustrating a method of calculating a lower limit value of irradiation amount based on a LER threshold value.

The irradiation amount lower limit value calculation unit 114 calculates an irradiation amount lower limit value of each shot (step S105). As shown in FIG. 9, the irradiation amount lower limit value calculation unit 114 calculates an irradiation amount lower limit value based on the correlation data between irradiation amount and LER stored in the storage unit 134, and the LER threshold value stored in the storage unit 136. Thus, an irradiation amount lower limit value is determined for each of the pattern area densities of approximately 0%, 50%, 100%, for instance.

Figure 10:
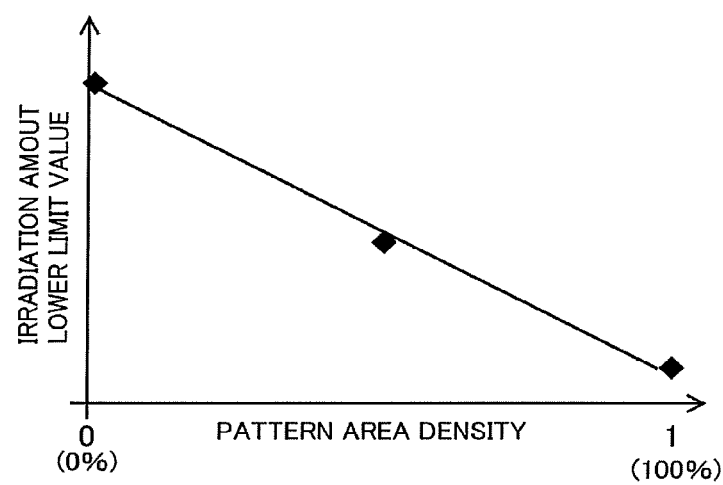
FIG. 10 is a graph showing a relationship between pattern area density and lower limit value of irradiation amount.

Next, as shown in FIG. 10, the irradiation amount lower limit value calculation unit 114 plots the calculated values with the horizontal axis representing pattern area density and the vertical axis representing irradiation amount lower limit value, then performs function fitting. The irradiation amount lower limit value calculation unit 114 determines an area density corresponding to each shot based on the pattern area density map, and substitutes the area density into the function to calculate the irradiation amount lower limit value of each shot. The irradiation amount lower limit value is a minimum irradiation amount necessary for the LER of a pattern to be formed to satisfy an acceptable value.

The irradiation amount determination unit 115 determines whether or not the irradiation amount defined in the shot data of each shot is greater than or equal to the irradiation amount lower limit value calculated by the irradiation amount lower limit value calculation unit 114 (step S106). When the defined irradiation amount is greater than or equal to the irradiation amount lower limit value, the shot data as it is, is outputted to the control circuit 120 (step S106_Yes).

When the defined irradiation amount is less than the irradiation amount lower limit value (step S106_No), the irradiation amount resetting unit 116 changes (increases) the irradiation amount defined in the shot data to the irradiation amount lower limit value resets the irradiation amount of the shot data (step S107).

When the irradiation amount of electron beam is increased, finished dimensions increase. For this reason, the shot size adjustment unit 117 calculates a dimensional increase due to the increase in the irradiation amount in step S107, based on the DL information stored in the storage unit 132, and reduces the shot figure size defined in the shot data by the dimensional increase (step S108).

Figure 11:
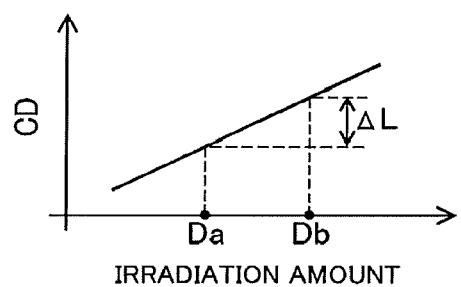
FIG. 11 is a graph illustrating a dimensional variation according to a change in the irradiation amount.

For instance, when change of the irradiation amount defined in the shot data from the original irradiation amount Da to the irradiation amount lower limit value Db in step S107 causes an increase of the finished dimensions of the pattern by $\Delta L$ (in each of x direction, y direction) as shown in FIG. 11, the shot figure size defined in the shot data is decreased by $\Delta L$ (in each of x direction, y direction). Consequently, even when the irradiation amount is changed, the same finished dimensions can be obtained.

Figure 12:
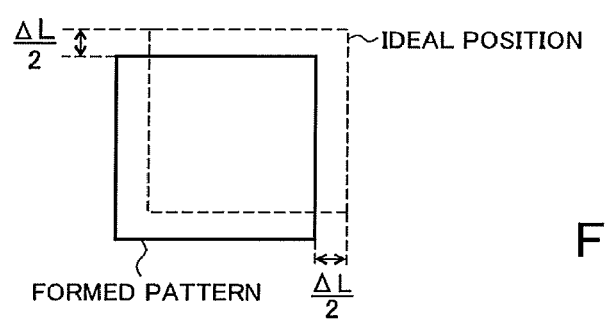
FIG. 12 is a diagram illustrating a displacement of a drawing position.

As shown in FIGS. 4A, 4B, change of the shot figure size causes a change in the size of the portion which passes through the variable shaping opening 34 of the first aperture image 50. However, since the position of apex C of the variable shaping opening 34 is a fixed point, when drawing is made as it is, a pattern is formed at a position displaced from an ideal position by $\Delta L/2$ (half the amount of dimensional change in step S108) in each of x direction, y direction as shown in FIG. 12.

For this reason, the shot position adjustment unit 118 changes the irradiation position defined in the shot data to a side diagonally from the fixed point by just $\Delta L/2$ (in each of x direction, y direction) (step S109). Consequently, even when the irradiation amount is changed, a pattern can be formed at the same position.

Like this, when the defined irradiation amount is less than the irradiation amount lower limit value, the irradiation amount, shot size, and shot position are changed, and outputted to the control circuit 120.

The control circuit 120 receives from the control computer 110 shot data in which an irradiation amount greater than or equal to the irradiation amount lower limit value is defined, and controls the drawing unit 200 to draw a pattern on the substrate 240 (step S110). The control circuit 120 irradiates with an electron beam for the irradiation amount (irradiation time t) defined for each shot figure, using the inputted shot data, and after elapse of the irradiation time t, applies a deflection voltage to the blanker 203 so as to shield the electron beam. In addition, the control circuit 120 calculates a deflection amount for deflecting the electron beam to a defined drawing position, in accordance with the shot data. Similarly, calculates a deflection amount for shaping a figure with the figure type and size defined for each shot figure. The control circuit 120 then applies a deflection voltage for each deflection amount to corresponding one of the deflector 206, the main deflector 209, and the secondary deflector 210 via a DAC amplifier which is not illustrated.

As such, according to this embodiment, an irradiation amount for correcting a dimensional variation caused by a proximity effect, foggy, a loading effect and the like is reduced. In the case where a desired LER quality is not satisfied, the LER can be improved by increasing the irradiation amount up to an irradiation amount lower limit value that allows the LER quality to be satisfied. Since the irradiation amount is just increased to the irradiation amount lower limit value when the irradiation amount defined in the shot data is lower than the irradiation amount lower limit value, decrease in the throughput can be reduced compared with a technique that increases the base dose.

Also, a pattern having desired dimensions can be formed at a desired position by adjusting the shot figure size and the irradiation position of a shot defined in the shot data in consideration of a variation in the dimensions and position of a finished pattern according to a change in the irradiation amount.

In the embodiment, the function for calculating an irradiation amount lower limit value from the pattern area density as shown in FIG. 10 may be determined in advance externally of the drawing apparatus.

When the shot figure size is changed (reduced) in step S108 of FIG. 8, the pattern area density is slightly changed, and the irradiation amount lower limit value (a minimum irradiation amount necessary for the LER of a pattern to be formed to satisfy an acceptable value) may also be changed. Thus, an amount of change in the shot figure size may be determined by taking a change in the irradiation amount lower limit value according to a change in the shot figure size into consideration.

In the aforementioned embodiment, instead of the LER, LWR (Line Width Roughness) may be used.

Although a configuration in which the substrate 240 is irradiated with an electron beam has been described in the aforementioned embodiment, the substrate 240 may be irradiated with another charged particle beam such as an ion beam.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam drawing apparatus comprising:
an area density calculation processing circuitry calculating a pattern area density of a pattern to be drawn on a substrate based on drawing data;
a shot data generation processing circuitry generating shot data which is formed of shot of a charged particle beam as a component unit using the drawing data, and in which a shot size, a shot position and an irradiation amount are defined;
an irradiation amount determination processing circuitry determining whether or not the irradiation amount defined in the shot data is greater than or equal to an irradiation amount lower limit value corresponding to the pattern area density;
an irradiation amount resetting processing circuitry changing the irradiation amount in the shot data to the irradiation amount lower limit value when the irradiation amount defined in the shot data is less than the irradiation amount lower limit value;
a shot size adjustment processing circuitry changing the shot size defined in the shot data, based on an amount of the change in the irradiation amount made by the irradiation amount resetting processing circuitry;
a shot position adjustment processing circuitry changing the shot position defined in the shot data, based on an amount of the change in the shot size made by the shot size adjustment processing circuitry; and
a drawing device drawing a pattern by irradiating the substrate with the charged particle beam, using the shot data in which the irradiation amount, the shot size, and the shot position have been changed.

2. The apparatus according to claim 1, further comprising:
a first memory storing information specifying a relationship between an irradiation amount of the charged particle beam and a size of a pattern to be drawn,
wherein the shot size adjustment processing circuitry determines an amount of variation in a pattern size due to the change in the irradiation amount based on the information, and sets an amount of change in the shot size to the amount of variation.

3. The apparatus according to claim 1,
wherein the shot position adjustment processing circuitry changes the shot position to a side diagonally from a fixed point of the shot by half the amount of the change in the shot size.

4. The apparatus according to claim 1, further comprising:
a second memory storing correlation data between an irradiation amount of the charged particle beam and LER (Line Edge Roughness) of the pattern to be drawn, for each of a plurality of pattern area densities; and
an irradiation amount lower limit value calculation processing circuitry calculating an irradiation amount lower limit value for each of the pattern area densities based on a threshold value of the LER required for the pattern to be formed on the substrate and the correlation data, generating a function by fitting the calculated value, and substituting the pattern area density calculated by the area density calculation processing circuitry into the function to calculate an irradiation amount lower limit value.

5. A charged particle beam drawing method comprising:
calculating a pattern area density of a pattern to be drawn on a substrate based on drawing data;
generating shot data which is formed of shot of a charged particle beam as a component unit using the drawing data, and in which a shot size, a shot position and an irradiation amount are defined;
determining whether or not the irradiation amount defined in the shot data is greater than or equal to an irradiation amount lower limit value corresponding to the pattern area density;
when the irradiation amount defined in the shot data is less than the irradiation amount lower limit value, changing the irradiation amount in the shot data to the irradiation amount lower limit value;
changing the shot size defined in the shot data, based on an amount of the change in the irradiation amount;
changing the shot position defined in the shot data, based on an amount of the change in the shot size; and making drawing by irradiating the substrate with the charged particle beam, using the shot data in which the irradiation amount, the shot size, and the shot position have been changed.

6. The method according to claim 5, wherein an amount of variation in a pattern size due to the change in the irradiation amount is determined based on information that is stored in a first memory and that specifies a relationship between an irradiation amount of the charged particle beam and a size of a pattern to be drawn, and an amount of change in the shot size is set to the amount of variation.

7. The method according to claim 5, wherein the shot position is changed to a side diagonally from a fixed point of the shot by half the amount of the change in the shot size.

8. The method according to claim 5, wherein based on a threshold value of LER (Line Edge Roughness) required for a pattern to be formed on the substrate, and correlation data which is stored in a second memory and which is between an irradiation amount of the charged particle beam and the LER of the pattern to be drawn, for each of a plurality of pattern area densities, an irradiation amount lower limit value is calculated for each of the pattern area densities, a function is generated by fitting the calculated value, and the calculated pattern area density is substituted into the function and an irradiation amount lower limit value is calculated.

\* \* \* \* \*